United States Patent
Chen et al.

(10) Patent No.: US 10,545,403 B2
(45) Date of Patent: Jan. 28, 2020

(54) PHOTOSENSITIVE RESIN COMPOSITION AND DRY FILM PHOTORESIST CONTAINING THE SAME

(71) Applicant: Chang Chun Plastics Co., Ltd, Taipei (TW)

(72) Inventors: Gai-Chi Chen, Taipei (TW); Yun-Chung Wu, Taipei (TW); An-Pang Tu, Taipei (TW); Kuen-Yuan Hwang, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 6 days.

(21) Appl. No.: 15/790,948

(22) Filed: Oct. 23, 2017

(65) Prior Publication Data
US 2018/0120700 A1 May 3, 2018

(30) Foreign Application Priority Data
Oct. 28, 2016 (TW) .............................. 105135094 A

(51) Int. Cl.
| | | |
|---|---|---|
| *G03F 7/035* | (2006.01) | |
| *C08G 18/75* | (2006.01) | |
| *C08G 18/76* | (2006.01) | |
| *C08G 18/77* | (2006.01) | |
| *C08G 18/71* | (2006.01) | |
| *G03F 7/027* | (2006.01) | |
| *C08G 71/04* | (2006.01) | |
| *H05K 3/06* | (2006.01) | |
| *H01L 21/027* | (2006.01) | |
| *H05K 3/28* | (2006.01) | |

(52) U.S. Cl.
CPC ............ *G03F 7/035* (2013.01); *C08G 18/711* (2013.01); *C08G 18/75* (2013.01); *C08G 18/758* (2013.01); *C08G 18/76* (2013.01); *C08G 18/771* (2013.01); *C08G 18/775* (2013.01); *C08G 71/04* (2013.01); *G03F 7/027* (2013.01); *H05K 3/064* (2013.01); *C08G 18/7607* (2013.01); *C08G 18/7614* (2013.01); *C08G 18/7657* (2013.01); *C08G 18/7685* (2013.01); *H01L 21/0274* (2013.01); *H05K 3/287* (2013.01)

(58) Field of Classification Search
CPC ....... G03F 7/035; C08G 18/75; C08G 18/758; C08G 18/76; C08G 18/7607; C08G 18/7614; C08G 18/7657; C08G 18/7685; C08G 18/771; C08G 18/775
See application file for complete search history.

(56) References Cited

U.S. PATENT DOCUMENTS

2016/0238929 A1* 8/2016 Schmidt ................. G03F 7/028

FOREIGN PATENT DOCUMENTS

| JP | 2000250212 A | * | 9/2000 |
| JP | 2000250213 A | * | 9/2000 |

* cited by examiner

*Primary Examiner* — John S Chu
(74) *Attorney, Agent, or Firm* — Muncy, Geissler, Olds & Lowe, P.C.

(57) ABSTRACT

The present invention provides a photosensitive resin composition, comprising: (a) photo-polymerizable unsaturated compound, (b) hydroxyurethane compound, and (c) photoinitiator. The photosensitive resin composition can be used as photoresist coating for dry film photoresist to manufacture the electronic components, such as print circuit board and so on. Further, the (b) hydroxyurethane compound having [CC]/[NH$_2$] between 0.5 and 0.9, which increases the resolution, adhesion, and stripping ability of photosensitive resin composition for dry film photoresist, and improves the effectiveness and the quality of dry film photoresist for manufacturing printed circuit board and other electric component.

11 Claims, No Drawings

PHOTOSENSITIVE RESIN COMPOSITION AND DRY FILM PHOTORESIST CONTAINING THE SAME

BACKGROUND OF THE INVENTION

1. Technical Field

The present invention relates to photosensitive resin composition, which can be used as photoresist coating and dry film photoresist.

2. Description of Related Art

Dry film photoresists are used as a component of printed circuit boards, lead frames, plasma display panels and ITO electrodes or black matrices for other displays. As compared to a wet film photoresist, a dry film photoresist is more advantageous due to its benefits related to quick manufacturing, even surface and small thickness, and is particularly suitable to circuit boards with holes. In use, a dry film photoresist is built on a carrier film. After the coat is dried, another layer of thin film, such as polyethylene thin film, is put on the coating layer, so as to form a dry film photoresist.

Throughout the process of making a printed circuit board, a dry film photoresist undergoes steps including rubbing, lamination, exposure, developing, etching, and stripping. Therein, the results of exposure and developing are subject to the properties of the dry film photoresist used. Generally, the thinner the dry film photoresist is, the better the resolution and the evener the etched surfaces are. Where the dry film photoresist has an excessively rough surface, its conformability and adhesion to other substrates degrade.

With the trend of electronic devices and products to be more compact and more sophisticated, more and more complicated circuits have to be made on more and more miniature printed circuit boards. Thus, it has been a common challenge for the relevant dealers to improve reproducibility and resolution of patterns by finding out a dry film photoresist that can effectively adhere to a substrate, can be quickly stripped without residual, and can provide good etching resolution.

SUMMARY OF THE INVENTION

Currently, compositions of urethane (meth)acrylate compounds and compositions containing carboxyl-group-containing urethane (meth)acrylate compounds have been used as photosensitive resin compositions for making dry film photoresist. However, when these known photosensitive resin compositions are used in a dry film photoresist, they tend to leave residual dry film behind after the film stripping step. For example, when such a composition is applied to a substrate having holes, the dry film flash tends to appear around the holes. While slowing down the film stripping operation may mitigate this problem, production efficiency is nevertheless compromised. Yet the residual dry film can have an adverse impact on development resolution. Briefly, a dry film photoresist made of urethane photosensitive resin compositions usually leads to poor film stripping and low resolution.

To solve the foregoing problems, the present invention provides a photosensitive resin composition, which has high resolution, high adhesion, and good strippability. When used in a dry film photoresist, it improves the production yield without prolonging the production process, thus being very suitable for electronic products such as printed circuit boards.

Therefore, the present invention is to provide a photosensitive resin composition, which comprises: (a) photo-polymerizable unsaturated compound, (b) hydroxyurethane compound, and (c) photoinitiator.

In a preferable embodiment, the (b) hydroxyurethane compound is an unsaturated-double-bond-containing hydroxyurethane compound, and has a structure of Formula (I):

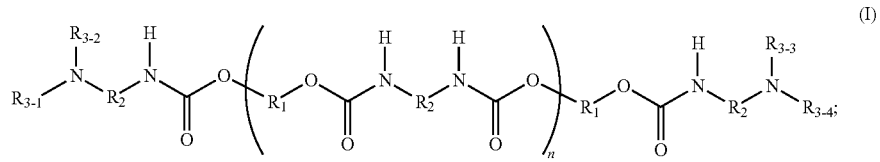

wherein, n is an integer of 0~10;

$R_1$ is selecting from the group consisting of Formulas (II)~(IV):

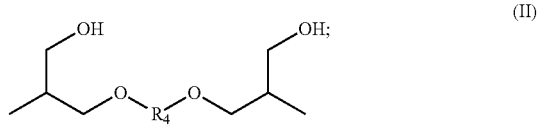

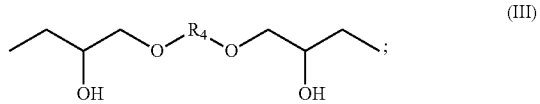

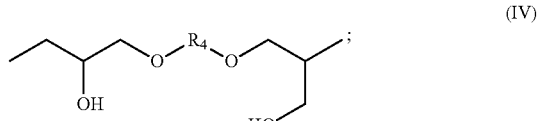

$R_4$ is $C_4$-$C_{12}$ alkyl, alkenyl, alkynyl, cycloalkyl or a polyether group or has a structure of Formula (V):

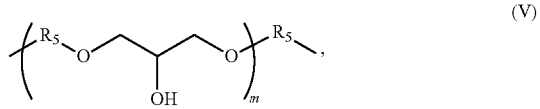

wherein, m is an integer of 0~5, and $R_5$ is of the following structural formula:

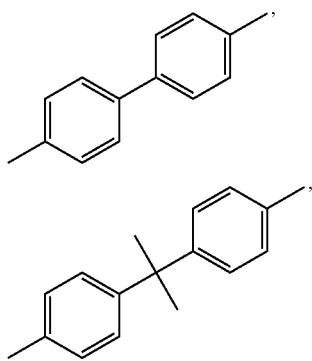

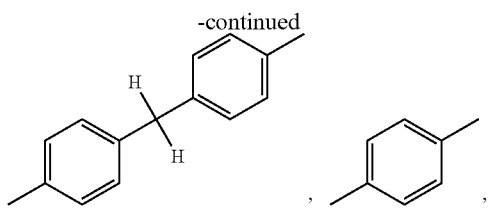

$R_2$ is $C_4$-$C_{12}$ alkyl, cycloalkyl, aryl, a polyether group, or enamine group;

$R_{3-1~3-4}$ are independently identical or different, and are hydrogen, $C_4$-$C_{12}$ alkyl, alkenyl, cycloalkyl, aryl, or polyether group, wherein at least one of $R_{3-1~3-4}$ contains an unsaturated-double-bond group.

In a preferable embodiment, the (b) hydroxyurethane compound is characterized in having a [CC]/[NH$_2$] ratio of 0.5~0.9.

In a preferable embodiment, the (b) hydroxyurethane compound is characterized in having a [CC]/[NH$_2$] ratio of 0.5~0.75.

In a preferable embodiment, the (b) hydroxyurethane compound is characterized in having a [EPDXY]/[AHEW] ratio of 0.35~1.

In a preferable embodiment, the photosensitive resin composition further comprises a solvent.

In a preferable embodiment, the solvent is any one or more than one selected from the group consisting of alcohols, ethers, and ketones.

In a preferable embodiment, with respect to 100 mass fractions of the (a) photo-polymerizable unsaturated compound, the (b) hydroxyurethane compound is 5 to 50 mass fractions.

In a preferable embodiment, the photosensitive resin composition is used as a photoresist coating.

Another aspect of the present invention is to provide a dry film photoresist comprising a carrier film, a photoresist layer made of the foregoing photosensitive resin composition, and a cover film.

Still another aspect of the present invention is to provide a hydroxyurethane compound, which has a structure of Formula (I):

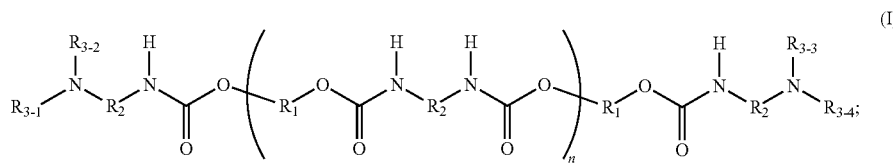

wherein, n is an integer of 0~10;

$R_1$ is selecting from the group consisting of Formulas (II)~(IV):

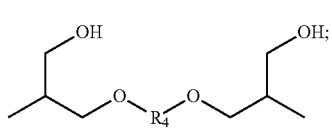

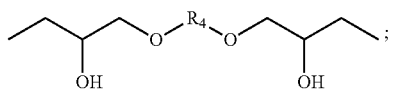

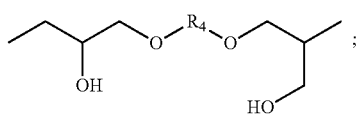

$R_4$ is $C_4$-$C_{12}$ alkyl, alkenyl, alkynyl, cycloalkyl or a polyether group or has a structure of Formula (V):

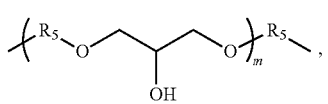

wherein, m is an integer of 0~5, and $R_5$ is of the following structural formula:

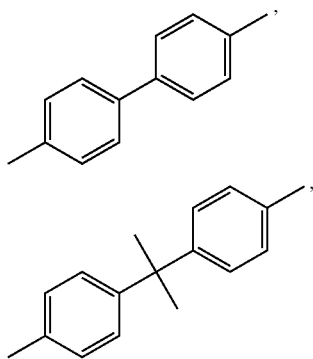

-continued

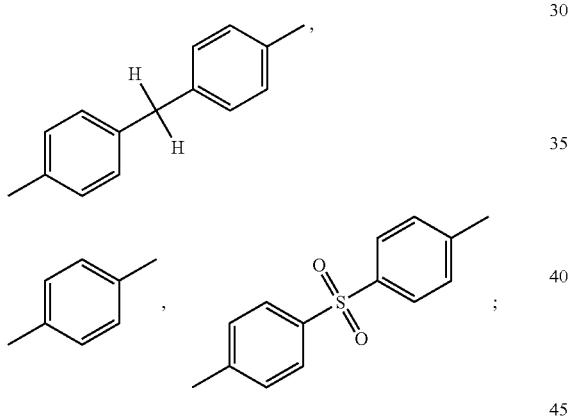

$R_2$ is $C_4$-$C_{12}$ alkyl, cycloalkyl, aryl, a polyether group, or enamine group;

$R_{3\text{-}1\sim3\text{-}4}$ are independently identical or different, and are hydrogen, $C_4$-$C_{12}$ alkyl, alkenyl, cycloalkyl, aryl, or polyether group, wherein at least one of $R_{3\text{-}1\sim3\text{-}4}$ contains an unsaturated-double-bond group.

DETAILED DESCRIPTION OF THE INVENTION

The present invention provides a photosensitive resin composition, which comprises: (a) photo-polymerizable unsaturated compound, (b) hydroxyurethane compound, and (c) photoinitiator.

The (a) photo-polymerizable unsaturated compound includes compounds whose molecular structure contains unsaturated alkenyl bonds. As a monomeric compound, the photo-polymerizable unsaturated compound can be (meth) acrylic acid, crotonic acid, 4-pentenoic acid, 5-hexenoic acid, sorbic acid, 6-heptenoic acid, α-bromo(meth)acrylic acid, β-furan (meth)acrylic acid, β-styryl (meth)acrylic acid, maleic acid, fumaric acid, cinnamic acid, α-cyanocinnamic acid, itaconic acid, crotonic acid, methyl methacrylate, butyl methacrylate, and hydroxy propyl acrylate. Therein (meth) acrylic acid is particularly preferred. Besides these monomeric compounds, the photo-polymerizable unsaturated compound can be reactive resins polymerized by the above mentioned monomeric compounds and having polymerziable double bonds, such as (meth)acrylic acid resin, modified acrylic acid resin, (meth)acrylate resin, or modified acrylate resin. The above mentioned monomeric compounds and resins can be co-existed.

Another aspect of the present invention is to provide a hydroxyurethane compound, which is an unsaturated-double-bond-containing hydroxyurethane compound, and has a structure of Formula (I):

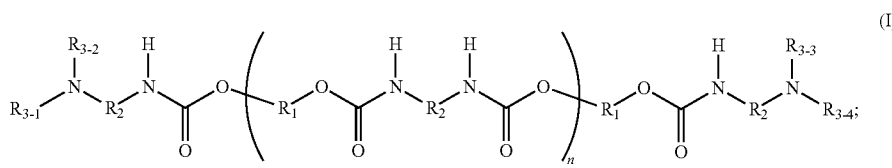

(I)

wherein, n is an integer of 0~10;

$R_1$ is selecting from the group consisting of Formulas (II)~(IV):

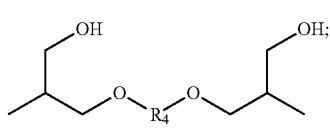

(II)

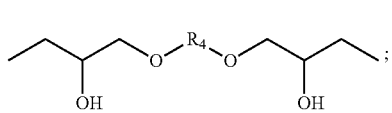

(III)

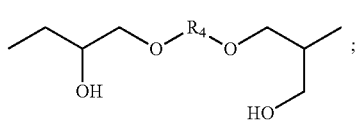

(IV)

$R_4$ is $C_4$-$C_{12}$ alkyl, alkenyl, alkynyl, cycloalkyl or a polyether group or has a structure of Formula (V):

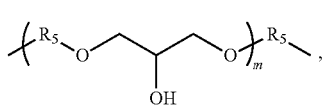

(V)

wherein, m is an integer of 0~5, and $R_5$ is of the following structural formula:

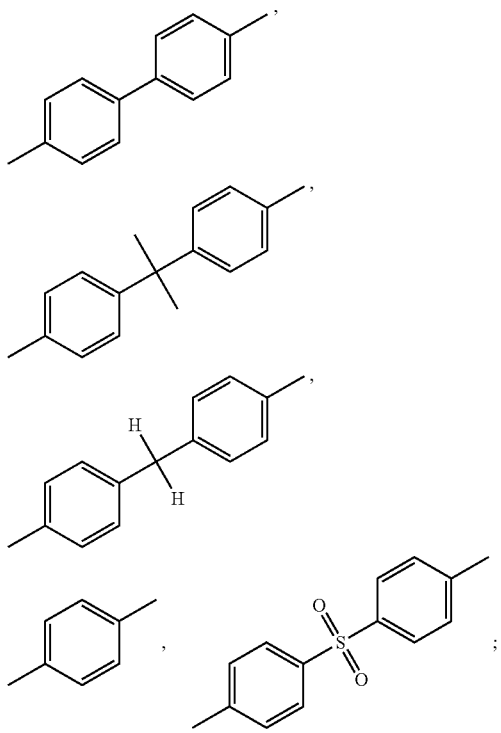

$R_2$ is $C_4$-$C_{12}$ alkyl, cycloalkyl, aryl, a polyether group, or enamine group;

$R_{3\text{-}1\sim3\text{-}4}$ are independently identical or different, and are hydrogen, $C_4$-$C_{12}$ alkyl, alkenyl, cycloalkyl, aryl, or polyether group, wherein at least one of $R_{3\text{-}1\sim3\text{-}4}$ contains an unsaturated-double-bond group.

The $C_4$-$C_{12}$ alkyl of $R_4$ and $R_2$ may be straight-chain or branched-chain, such as n-butyl, isobutyl, tert-butyl, pentyl, or isopentyl.

The alkenyl of $R_4$ may be substituted or unsubstituted alkenyl, such as vinyl, 1-allyl, or 2-allyl, or alkenyl having substituents, such as 1-methyl vinyl, 1-butenyl, 2-butenyl, 3-butenyl, 1-methyl-1-allyl, 2-methyl-1-allyl, 1-methyl-2-allyl, 2-methyl-2-allyl, 1-pentenyl, 2-pentenyl, 3-pentenyl, 4-pentenyl, 1-methyl-1-butenyl, 2-methyl-1-butenyl, 3-methyl-1-butenyl, 1-methyl-2-butenyl, 2-methyl-2-butenyl, 3-methyl-2-butenyl, 1-methyl-3-butenyl, 2-methyl-3-butenyl, 3-methyl-3-butenyl, 1,1-dimethyl-2-allyl, 1,2-dimethyl allyl, 1-ethyl-1-allyl, 1-ethyl-2-allyl, 1-hexenyl, 2-hexenyl, 3-hexenyl, 4-hexenyl, or 5-hexenyl.

The alkynyl of $R_4$ may be substituted or unsubstituted alkynyl, such as ethynyl, 1-propynyl, 2-propynyl, 1-butynyl, 3-butynyl, 1-methyl-2-propynyl, 1-pentynyl, 2-pentynyl, 3-pentynyl, 1-methyl-2-butynyl, 1-methyl-3-butynyl, 2-methyl-3-butynyl, 3-methyl-1-butynyl, 1,1-dimethyl-2-propynyl, 1-ethyl-2-propynyl, 1-hexynyl, 2-hexynyl, 3-hexynyl, 4-hexynyl, or 5-hexynyl.

The cycloalkyl of $R_4$ and $R_2$ may be substituted or unsubstituted cycloalkyl, such as cyclopentyl, cyclohexyl, cycloheptyl or cyclooctyl.

The aryl of $R_2$ may be substituted or unsubstituted aryl, such as phenyl, 1-naphthyl, or 2-naphthyl, or aryl having substituents, such as 2-methyl phenyl, 3-methyl phenyl, 4-methyl phenyl, 2-ethylphenyl, 3-ethylphenyl, 4-ethylphenyl, benzyl, 1-phenyl ethyl, 2-phenyl ethyl, 3-phenyl propyl, 1-phenyl butyl, 2-phenyl butyl, 3-phenyl butyl, or 4-phenyl butyl.

The enamine group of $R_2$ may be but not limited to a diethylenetriamine group.

The polyether group of $R_4$ and $R_2$ may be a polyether group of —O—($R_6$—O)m-$R_7$—, —$R_7$—O—($R_6$—O)m- or —$R_7$—O—($R_6$—O)m-$R_7$—, wherein, $R_6$ and $R_7$ are aliphatic bivalent alkyl, which are identical or different, straight-chain or branched-chain, saturated or unsaturated, and substituted or unsubstituted, and m is greater than 1. For example, the polyether group may be selected from the polyether groups formed by epoxy ethane, epoxy propane and epoxy butane.

$R_{3\text{-}1\sim3\text{-}4}$ are independently identical or different, and may be hydrogen, $C_4$-$C_{12}$ alkyl, alkenyl, cycloalkyl, aryl, or polyether group, which at least one of $R_{3\text{-}1\sim3\text{-}4}$ contains an unsaturated-double-bond-containing group. The unsaturated-double-bond-containing group may be a substituted or unsubstituted (meth)acrylic carboalkoxy, or (meth)acrylic aryl ether group, or any unsaturated-double-bond-containing groups having a (meth)acrylate group.

The (b) hydroxyurethane compound is characterized in having a [CC]/[NH$_2$] ratio of 0.1~0.9 and/or a [EPDXY]/[AHEW] ratio of 0.125~1. Therein, the [CC]/[NH$_2$] ratio is preferably of 0.5~0.75, such as 0.50, 0.53, 0.55, 0.58, 0.60, 0.63, 0.65, 0.66, 0.68, 0.70, 0.73, 0.75, 0.78, 0.80, 0.83, 0.85, 0.88, and 0.9; and the [EPDXY]/[AHEW] ratio may be 0.125, 0.15, 0.20, 0.25, 0.30, 0.35, 0.40, 0.45, 0.50, 0.55, 0.60, 0.65, 0.70, 0.75, 0.80, 0.85, 0.90, 0.95, and 1.0. Hydroxyurethane compound having its [CC]/[NH$_2$] ratio of 0.5~0.9 helps to improve resolution, adhesion, and strippability of the photosensitive resin composition of the dry film photoresist.

With respect to 100 mass fractions of the foregoing (a) photo-polymerizable unsaturated compound, the foregoing (b) hydroxyurethane compound is 5 to 50 mass fractions, such as 5 mass fractions, 10 mass fractions, 15 mass fractions, 20 mass fractions, 25 mass fractions, 30 mass fractions, 35 mass fractions, 40 mass fractions, 45 mass fractions, and 50 mass fractions.

The (c) photoinitiator may be 2,2',-bis(2-chlorophenyl)-4,4',5,5',-tetraphenyl-1,2'-diimidazole, 2-ethyl anthrone, 2-isopropyl thiaxanthrone, 2-tertiary butyl anthrone, 4-isopropyl thiaxanthrone1-hydroxyl cyclohexyl phenyl ketone, 2,2-dimethoxy-1,2-diphenyl ethane-1-one, 2-methyl-1-[4-(methylthio)phenyl]-2-morpholinepropane-1-one, 2-benzyl-2-dimethylamino-1-[4-morpholinephenyl]butane-1-one, 2-hydroxyl-2-methyl-1-phenyl propane-1-one, 2,4,6-trimethyl benzoyl diphenyl phosphine oxide, 1-[4(2-hydroxyl methoxy)phenyl]-2-hydroxyl-2-methyl propane-1-one, 2,4-diethylthioxanthone, 2-chlorothioxanthone, 2,4-dimethyl thioxanthone, 3,3-dimethyl-4-methoxy benzyl phenyl ketone, benzyl phenyl ketone, 1-chloro-4-propoxythioxanthone, 1-(4-isopropyl phenyl)2-hexyloxy-2-methyl propane-1-one, 1-(4-dodecyl phenyl)-2-hydroxyl-2-methyl propane-1-one, 4-benzoyl-4'-methyl dimethyl sulfide, 4-dimethyl aminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxy acetophenone, benzophenone dimethyl acetal, benzophenone β-methoxy diethyl acetic acid, 1-phenyl-1,2-propyl dioxime-O,O'-(2-carbonyl) ethoxy ether, O-benzoyl methyl benzoate, bis[4-dimethyl aminophenyl]ketone, benzophenone, 4,4'-bis(dimethyl amino)benzophenone, 4,4'-dichlorobenzophenone, benzyl, benzoin, benzyloxy benzoin, phenethyloxy benzoin, isopropoxy benzoin, isobutoxy benzoin, neo-butoxy benzoin, benzoin methyl ether, benzoin ethyl ether, benzoin isopropyl ether, a benzyl compound, p-dimethyl aminoacetophenone, p-neo-butyl trichloroacetophenone, p-neobutyl dichloroacetophenone, thioxanthone, 2-methyl thioxanthone, 2-isopropyl methyl thioxanthone, dibenzosuberone, α,α-dichloro-4-phenoxyacetophenone, and 4-dimethyl amino amyl benzoate, 2,4,5-triaryl imidazole dimer or derivatives thereof, lobine dimer, or dyes, such as colorless triphenylmethane, triarylmethane colorless dyes, and composites containing dyes and lobine dimers. Preferably, it is 2-isopropyl thiaxanthrone or 2,2',-bis(2-chlorophenyl)-4,4',5,5',-tetraphenyl-1,2'-diimidazole.

The foregoing photosensitive resin composition further comprises a solvent. Therein, the solvent is any one or more than one selected from the group consisting of alcohols, ethers, and ketones. The alcohols include glymes such as monoglyme, diglyme, and triglyme. The ethers include propylene glycol monoalkyl ethers, such as proprylene glycol monomethyl ether, proprylene glycol monoethyl ether, proprylene glycol monobutyl ether, proprylene glycol monoisobutyl ether, and proprylene glycol tert-butyl ether. The ketones include acetone, and methyl ethyl ketone. Among the foregoing solvents, propylene glycol methyl ether or methyl ethyl ketone is preferred. The amount of the solvent is preferably 1~20 wt %, more preferably 2~10 wt %, and most preferably 2~7 wt %, such as 1 wt %, 2 wt %, 5 wt %, 7 wt %, 10 wt %, 12 wt %, 15 wt %, 17 wt %, and 20 wt %, based on the total weight of the photosensitive resin composition.

The disclosed photosensitive resin composition may be used as a photoresist coating for making a dry film photoresist. The photoresist coating is used to make a photoresist layer of a dry film photoresist through the steps of even coating and drying. The coating step may be performed using a conventional device for making a coating layer having a uniform thickness such as a reverse roll coater, a blade coater, a lip coater, a rod coater, a squeeze roll coater, a comma blade coater, a transfer roll coater, a photographic gravure coater, or a spray coater. The drying step may be performed using a conventional drying device such as an IR oven, a heating plate, a hot-air convection drying oven, or a convection oven. Generally, a film can be obtained through a drying process performed at 50~130° C. for 1~30 minutes. While the present invention puts no particularly limitation on the thickness of the coated photoresist layer, the dried film usually has a thickness of 10~300 μm, and preferably 12~240 μm, such as 10 μm, 12 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 105 μm, 110 μm, 115 μm, 120 μm, 125 μm, 130 μm, 135 μm, 140 μm, 145 μm, 150 μm, 155 μm, 160 μm, 165 μm, 170 μm, 180 μm, 185 μm, 190 μm, 195 μm, 200 μm, 205 μm, 210 μm, 215 μm, 220 μm, 225 μm, 230 μm, 235 μm, 240 μm, 245 μm, 250 μm, 255 μm, 260 μm, 265 μm, 270 μm, 275 μm, 280 μm, 285 μm, 290 μm, 295 μm, and 300 μm.

The dry film photoresist of the present invention includes a carrier film, a photoresist layer made of the foregoing photosensitive resin composition, and a cover film. For using the dry film photoresist in an electronic device such as a printed circuit board, the cover film of the dry film photoresist is removed by a roller of a laminating machine, and the intermediary photoresist layer is pressed on the heated copper-clad laminate by a laminating roller of 110±10° C. Under the high heat of the laminating roller, the photoresist layer is liquidized and able to stick onto the uniformly grained cooper surface. Therein, the carrier film, such as polyethylene terephthalate, is able to protect the photoresist layer, block oxygen, and prevent or inhibit photopolymerization. The cover film may be made of polyethylene, and serves to prevent the photoresist layer from adhering to other layers.

When used for making electronic devices such as printed circuit board, the disclosed dry film photoresist undergoes lamination, exposure, and developing, among others. In the manufacturing process, before lamination, the copper-clad laminate is ground using a grinding machine, washed with water and dried in flowing air. After the copper-clad laminate is heated to 80° C., the dry film photoresist is laminated to the copper-clad laminate under high heat and increased pressure. The combination is then cooled to the room temperature. At last, the laminated dry film photoresist is subject to exposure and developing. Therein, the copper-clad laminate may be a single-sided or double-sided copper-clad laminate. In the case of a single-sided copper-clad laminate, one of its surfaces is a copper foil and the other is a fiber reinforced epoxy resin layer. In the case of a double-sided copper-clad laminate, a fiber reinforced epoxy resin layer is sandwiched between two copper foils.

Another aspect of the present invention is to provide a hydroxyurethane compound, which is an unsaturated-double-bond-containing hydroxyurethane compound, and has a structure of Formula (I):

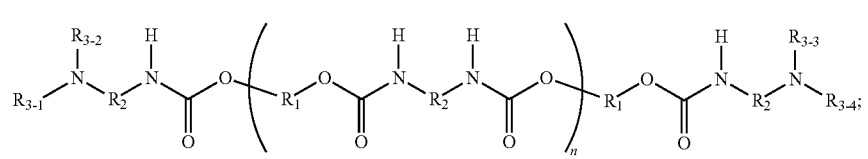

wherein, n is an integer of 0~10;

$R_1$ is selecting from the group consisting of Formulas (II)~(IV):

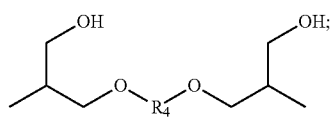

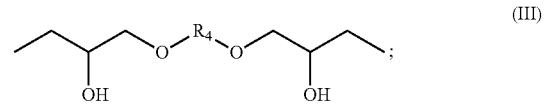

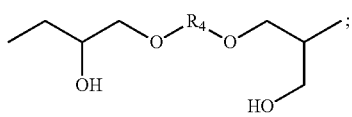

(IV)

$R_4$ is $C_4$-$C_{12}$ alkyl, alkenyl, alkynyl, cycloalkyl or a polyether group or has a structure of Formula (V) below:

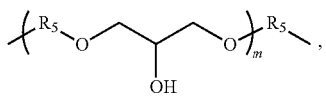

(V)

wherein, m is an integer of 0~5, and
$R_5$ is of the following structural formula:

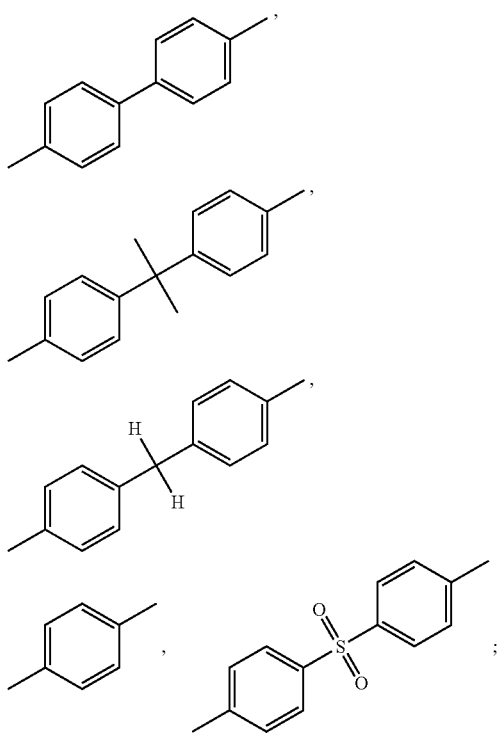

$R_2$ is $C_4$-$C_{12}$ alkyl, cycloalkyl, aryl, a polyether group, or enamine group;
$R_{3\text{-}1\sim 3\text{-}4}$ are independently identical or different, and are hydrogen, $C_4$-$C_{12}$ alkyl, alkenyl, cycloalkyl, aryl, or polyether group, wherein at least one of $R_{3\text{-}1\sim 3\text{-}4}$ contains an unsaturated-double-bond group.

The foregoing hydroxyurethane compound further technical features of $R_1$ to $R_5$ are as describes in the foregoing further technical features of $R_1$ to $R_5$.

EXAMPLES

The examples described below are intended to illustrate the principles of present invention but not to limit the scope of the present invention.

Materials for Preparation Examples

Diglycidyl ether of 1,4-butanediol, BDGE125: Diglycidyl ether of 1,4-butanediol produced by ChangChun Plastics. Co. Ltd. (Taiwan) whose epoxy equivalent weight is between 125 and 130 g/eq.

Poly(glycidyl ether) of bisphenol A, BE180: Poly(glycidyl ether) of bisphenol A produced by ChangChun Plastics. Co. Ltd. (Taiwan) whose epoxy equivalent weight is between 170 and 180 g/eq.

Polyetheramine, Jeffamine D230: polyetheramine produced by Huntsman Company.

Glycidyl methacrylate (GMA): supplied by Sartomer Company.

Hydroquinone monomethylether (MEHQ): supplied by Borregaard Company.

Methyl ethyl ketone

PREPARATION EXAMPLES

Preparation Example 1-1: Synthesis of BE180 Cyclic Carbonate

In a reactor, 100 g of BE180 epoxy resin, 0.1~5% of quaternary ammonium salt were added, mixed and heated to 150° C. With $CO_2$ introduced, the mixture reacted under 5 kg/cm$^2$ for 4 hr, so as to obtain BE180 cyclic carbonate. By calculating the consumption of $CO_2$, the conversion was determined as 93%.

Preparation Example 1-2: Synthesis of BDGE Cyclic Carbonate

In a reactor, 100 g of BDGE125 epoxy resin and 0.1~5% of quaternary ammonium salt were added, mixed and heated to 150° C. With $CO_2$ introduced, the mixture reacted under 5 kg/cm$^2$ for 4 hr, so as to obtain BDGE cyclic carbonate. By calculating the consumption of $CO_2$, the conversion was determined as 93%.

Preparation Example 2: Synthesis of Compounds S01 Through S05

BE180 cyclic carbonate of Preparation Example 1-1 and BDGE cyclic carbonate of Preparation Example 1-2 were taken to react with Jeffamine D230 polyetheramine respectively at 160° C. for 7 hours. The mixture was cooled to 80° C. and methyl ethyl ketone was added as a solvent so as to make the mixture a hydroxyurethane compound having 70% solid content. The test formulations are listed in Table 1 below.

TABLE 1

|  | S01 | S02 | S03 | S04 | S05 |
|---|---|---|---|---|---|
| [CC]/[NH$_2$] | 0.5 | 0.66 | 0.75 | 0.9 | 0.5 |
| BE180 cyclic carbonate (g) | 100.00 | 100.00 | 100.00 | 100.00 | — |
| BDGE125 cyclic carbonate (g) | — | — | — | — | 100.00 |
| Jeffamine D230 (g) | 107.78 | 81.65 | 71.85 | 59.88 | 165.37 |
| MEK (g) | 89.05 | 77.85 | 73.65 | 68.52 | 70.87 |

*[CC]: number of moles of cyclic carbonate; [NH$_2$]: number of moles of amine

Example 1: Synthesis of Unsaturated-Double-Bond-Containing Hydroxyurethane Compounds of S06 Through S13

Compounds of S01 through S0S synthesized in Preparation Example 2 was taken to react with glycidyl methacrylate (GMA) and hydroquinone monomethylether (MEHQ) at 65° C. for 4 hours, so as to obtain unsaturated-double-bond-containing hydroxyurethane compounds of S06 through S13 having the Formula (I) compound of the present invention. Therein, the unsaturated-double-bond-containing hydroxyurethane compounds S06 through S12 correspond to the disclosed Formula (I) compound, wherein $R_1$ is derived from bisphenol A and has the structures of Formulas (1) through (3) below; $R_2$ has the structure of Formula (4) below; $R_{3-1}$ and $R_{3-4}$ have the structures of Formulas (5) or (6) below; and $R_{3-2}$ and $R_{3-3}$ are hydrogen:

By introducing $R_4$ in $R_1$ to (V) and substituting $R_5$ in (V) with

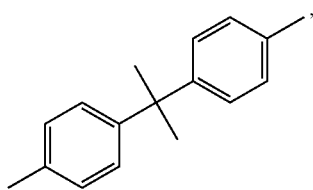

$R_1$ having the structure of Formulas (1) through (3) below was obtained

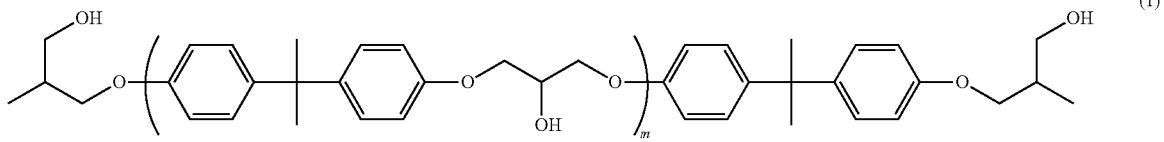
(1)

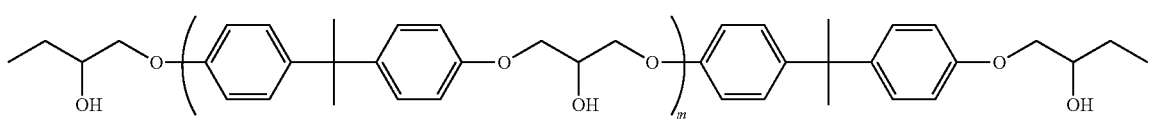
(2)

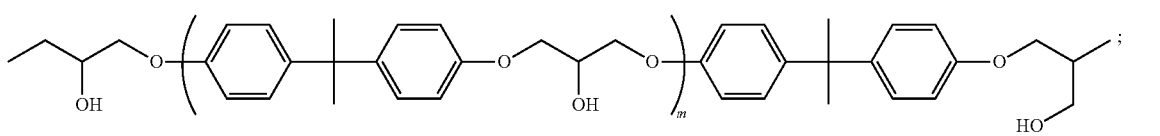
(3)

$R_2$:

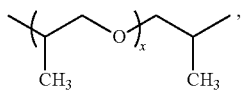
(4)

$x = 3$;

$R_{3-1}$ and $R_{3-4}$:

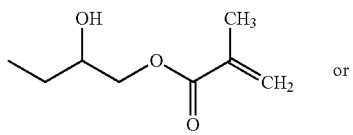
(5)

or

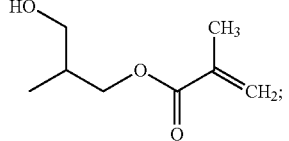
(6)

wherein, the unsaturated-double-bond-containing hydroxyurethane compound S13 corresponding to the disclosed Formula (I) compound is shown below, in which $R_1$ has the structure of Formulas (7) through (9) below; $R_2$ has the structure of Formula (4) below; $R_{3-1}$ and $R_{3-4}$ have the structure of Formulas (5) or (6) below, and $R_{3-2}$ and $R_{3-3}$ are hydrogen:

Introducing $R_4=C_4$ to Formulas (II)~(IV) in $R_1$:

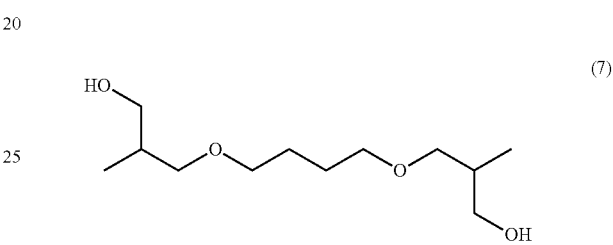
(7)

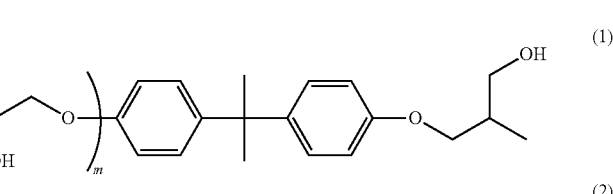
(8)

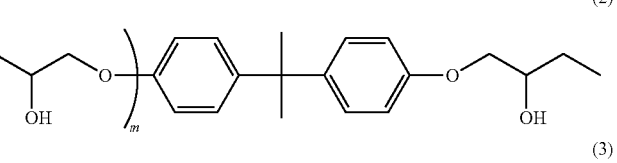
(9)

$R_2$:

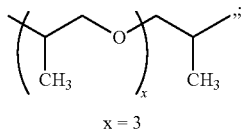

(4)

x = 3

$R_{3-1}$ and $R_{3-4}$:

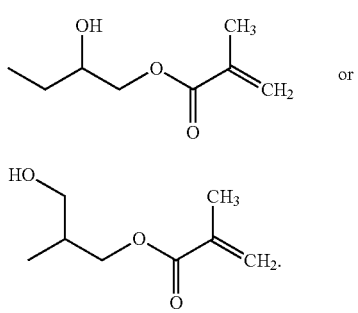

(5) or (6)

The test formulations are shown in Table 2. GMA provides the unsaturated double bond and MEHQ acts as an inhibitor for preventing the unsaturated double bond from the reaction.

a support and a photosensitive element was formed. Therein, the photoresist layer was 40 μm thick.

II. Formation of Photoresist Mask Pattern

The first step was to laminate copper foils (each having a thickness of 35 μm) at two surface of the fiber reinforced epoxy resin layer so as to form a double-sided copper-clad laminate. The copper surfaces of the copper-clad laminate were ground using a grinding machine equipped with a 600-mesh mill before washed with water and air dried. Then, the double-sided copper-clad laminate was heated to 80° C. and the foregoing photosensitive elements having the dry film photoresist compositions S14 through S33 were attached to the laminate so that the photoresist layer was closely adhered to the copper foil. The copper-clad laminate with a dry film photoresist was heated to 150° C. and pressurized to 2.5 kg/cm2. Afterwards, the combination was cooled to 23° C., so as to obtain a laminate which was a double-sided copper-clad laminate with each of its two surfaces provided with a photoresist layer.

Subsequently, put the Stouffer 21 steps sensitivity guide and photographic film for assessing resolution (CCP R-Pattern 5, L/S=1/1, I-shaped conductors of 5-150 μm) and adhesion (CCP A-Pattern 5, L/S=1/3, I-shaped conductors of 5-150 μm) on the on the laminate with dry film photoresist in sequence. In this case, the exposure obtained when a 5 kW high-pressure mercury lamp was used as the light source and 7 steps in the Stouffer 21-step sensitivity guide were left was taken as the measurement of photosensitivity.

The next step was to remove polyethylene terephthalate. The unexposed part was removed by using 1.0 wt % aqueous

TABLE 2

|  | S06 | S07 | S08 | S09 | S10 | S11 | S12 | S13 |
|---|---|---|---|---|---|---|---|---|
| [EPOXY/AHEW] | 0.35 | 0.35 | 0.35 | 0.35 | 0.50 | 0.80 | 1.00 | 0.35 |
| S01 (g) | 100.00 |  |  |  | 100.00 | 100.00 | 100.0 |  |
| S02 (g) |  | 100.00 |  |  |  |  |  |  |
| S03 (g) |  |  | 100.00 |  |  |  |  |  |
| S04 (g) |  |  |  | 100.00 |  |  |  |  |
| S05 (g) |  |  |  |  |  |  |  | 100.00 |
| GMA (g) | 32.97 | 25.18 | 22.05 | 17.35 | 47.10 | 75.36 | 94.21 | 39.79 |
| MEHQ (g) | 0.03 | 0.03 | 0.02 | 0.02 | 0.03 | 0.04 | 0.04 | 0.03 |

Note:
[EPOXY] is epoxy equivalent weight.
[AHEW] is amine hydrogen equivalent weight.

Example 2: Preparation and Characterization of Dry Film Photoresist Compositions from S14 Through S24 and from S26 Through S33, and Comparative Example S25

I. Preparation of Dry Film Photoresist

Photosensitive resin compositions of S14 through S33 were prepared using the formulas listed in Table 3 and Table 4. The solution was evenly applied to the carrier film of the 16 μm polyethylene terephthalate thin film. Then the coated solution (coating) was dried using a hot air convection dryer at 75° C. for 3.5 minutes. Thereby, the dry film photoresists having the photoresist layer containing the photosensitive resin compositions S14 through S33 was built on one surface of the polyethylene terephthalate thin film acting as sodium carbonate solution with developing spray pressure of 1.2 kg/cm² at 30° C. The minimal width of line intervals between lines having no snaking and gap was taken as the resolution. In addition, in the area where the unexposed part was removed completely, the minimal width of lines having no snaking and gap was taken as the adhesion. In the area where the unexposed part was removed completely, the minimal value of round spots having no gaps was taken as the spot adhesion. The values representing resolution, adhesion, film stripping time, spot adhesion and photosensitivity are all the smaller the better. The measurements of the examples and the comparative examples are summarized in Table 3 and Table 4 below.

TABLE 3

|  | S14 | S15 | S16 | S17 | S18 | S19 | S20 | S21 | S22 | S23 | S24 | S25 |
|---|---|---|---|---|---|---|---|---|---|---|---|---|
| S06 (g) | 10.2 |  |  |  |  |  |  |  |  | 50 |  |  |
| S07 (g) |  | 10.2 |  |  |  |  |  |  |  |  | 50 |  |

TABLE 3-continued

|  | | S14 | S15 | S16 | S17 | S18 | S19 | S20 | S21 | S22 | S23 | S24 | S25 |
|---|---|---|---|---|---|---|---|---|---|---|---|---|---|
| S08 (g) | | | | 10.2 | | | | | | | | | |
| S09 (g) | | | | | 10.2 | | | | | | | | |
| S10 (g) | | | | | | 10.2 | | | | | | 50 | |
| S11 (g) | | | | | | | 10.2 | | | | | | |
| S12 (g) | | | | | | | | 10.2 | | | | | |
| S13 (g) | | | | | | | | | 10.2 | | | | |
| Acrylate Acid Resin (g) | | 100 | 100 | 100 | 100 | 100 | 100 | 100 | 100 | 100 | 100 | 100 | 100 |
| BPE500 Monomer (g) | | | | | | | | | | | | | 10.2 |
| Photoinitiator BCIM (g) | | 0.84 | 0.84 | 0.84 | 0.84 | 0.84 | 0.84 | 0.84 | 0.84 | 0.84 | 0.84 | 0.84 | 0.84 |
| Photoinitiator ITX (g) | | 0.09 | 0.09 | 0.09 | 0.09 | 0.09 | 0.09 | 0.09 | 0.09 | 0.09 | 0.09 | 0.09 | 0.09 |
| Dye AMG (g) | | 0.07 | 0.07 | 0.07 | 0.07 | 0.07 | 0.07 | 0.07 | 0.07 | 0.07 | 0.07 | 0.07 | 0.07 |
| Solvent PM (g) | | 2.00 | 2.00 | 2.00 | 2.00 | 2.00 | 2.00 | 2.00 | 2.00 | 2.00 | 2.00 | 2.00 | 2.00 |
| Break Point (sec) | | 10.31 | 10.2 | 10.21 | 10.3 | 9.88 | 9.76 | 9.81 | 9.82 | 9.82 | 9.82 | 9.82 | 11.06 |
| Exposure Energy (7 Steps) | | 35 | 40 | 45 | 45 | 40 | 40 | 40 | 40 | 40 | 40 | 40 | 40 |
| $1^{st}$ Development | Resolution/Adhesion (μm) | 30/30 | 40/30 | 40/30 | 40/30 | 30/30 | 40/30 | 40/30 | 40/30 | 30/30 | 40/30 | 30/30 | 30/30 |
|  | Spot Adhesion (μm) | 30 | 30 | 30 | 30 | 30 | 30 | 30 | 30 | 30 | 30 | 30 | 30 |
| $2^{nd}$ Development | Resolution/Adhesion (μm) | 30/40 | 40/40 | 40/40 | 40/40 | 30/30 | 40/40 | 40/40 | 40/35 | 30/40 | 40/40 | 30/30 | 30/40 |
|  | Spot Adhesion (μm) | 40 | 40 | 40 | 40 | 40 | 40 | 40 | 40 | 40 | 40 | 40 | 50 |
| Film Stripping (sec) | | 27 | 27 | 27 | 28 | 28 | 28 | 28 | 25 | 25 | 25 | 26 | 40 |

TABLE 4

|  | | S26 | S27 | S28 | S29 | S30 | S31 | S32 | S33 |
|---|---|---|---|---|---|---|---|---|---|
| S08 (g) | | 10.2 | 50 | 80 | 100 | | | | |
| S09 (g) | | | | | | 10.2 | 50 | 80 | 100 |
| Acrylic Acid Monomer (g) | | 100 | 100 | 100 | 100 | 100 | 100 | 100 | 100 |
| BPE500 Monomer (g) | | | | | | | | | |
| Photoinitiator BCIM (g) | | 0.84 | 0.84 | 0.84 | 0.84 | 0.84 | 0.84 | 0.84 | 0.84 |
| Photoinitiator ITX (g) | | 0.09 | 0.09 | 0.09 | 0.09 | 0.09 | 0.09 | 0.09 | 0.09 |
| Dye AMG (g) | | 0.07 | 0.07 | 0.07 | 0.07 | 0.07 | 0.07 | 0.07 | 0.07 |
| Solvent PM (g) | | 2.00 | 2.00 | 2.00 | 2.00 | 2.00 | 2.00 | 2.00 | 2.00 |
| Break Point (sec) | | 10.21 | 10.22 | 10.24 | 10.21 | 9.85 | 9.83 | 9.82 | 9.81 |
| Exposure Energy (7 Steps) | | 45 | 45 | 45 | 45 | 45 | 45 | 45 | 45 |
| $1^{st}$ Development | Resolution/Adhesion (μm) | 40/30 | 40/30 | 40/30 | 40/30 | 30/30 | 40/30 | 40/30 | 40/30 |
|  | Spot Adhesion (μm) | 30 | 30 | 30 | 30 | 30 | 30 | 30 | 30 |
| $2^{nd}$ Development | Resolution/Adhesion (μm) | 40/40 | 40/40 | 40/40 | 40/40 | 30/30 | 40/40 | 40/40 | 40/35 |
|  | Spot Adhesion (μm) | 40 | 40 | 40 | 40 | 40 | 40 | 40 | 40 |
| Film Stripping (sec) | | 26 | 27 | 28 | 28 | 27 | 29 | 29 | 29 |

Note: BPE500: bisphenol A ethoxylate dimethacrylate

BCIM: 2,2'-bis(2-chlorophenyl)-4,4',5,5'-tetraphenyl-1,2'-biimidazole

ITX: 2-isopropyl thiaxanthrone

AMG: leuco-malachite green

PM: propylene glycol methyl ether

Comparative Example S25 is different from Examples S14 through S24 and Example S26 through S33 for it was made without hydroxyurethane compound of the present invention. As a result, Examples S14 through S24 and Example S26 through S33 were superior to Comparative Example S25 for having sooner break-point appearance, smaller spot adhesion in the $2^{nd}$ developing process, and faster film stripping. This proves that addition of hydroxyurethane compound as proposed by the present invention helps to improve dry film photoresist in terms of resolution, adhesion, and strippability. The results also show that when the photosensitive resin composition in the photoresist layer of the dry film photoresist contains hydroxyurethane compound having its [CC]/[NH$_2$] ratio between 0.5 and 0.9, and the [EPDXY]/[AHEW] ratio=0.35~1, the resulting dry film photoresist was improved in terms of resolution, adhesion, and strippability.

Thus, the photosensitive resin composition of the present invention when compared to normal photosensitive resin is more effective in improving dry film photoresist in terms of resolution, adhesion, and strippability, and is therefore particularly suitable for electronic devices such as printed circuit boards.

The present invention is more detailed illustrated by the above preferable example embodiment. While the present invention is not limited to the examples described above and that various replacements, changes, and modifications may be made without departing from the technical spirit and scope of the present invention.

What is claimed is:

1. A photosensitive resin composition, comprising: (a) photo-polymerizable unsaturated compound, (b) hydroxyurethane compound, and (c) photoinitiator;
wherein the (b) hydroxyurethane compound is an unsaturated-double-bond-containing hydroxyurethane compound, and has a structure of Formula (I):

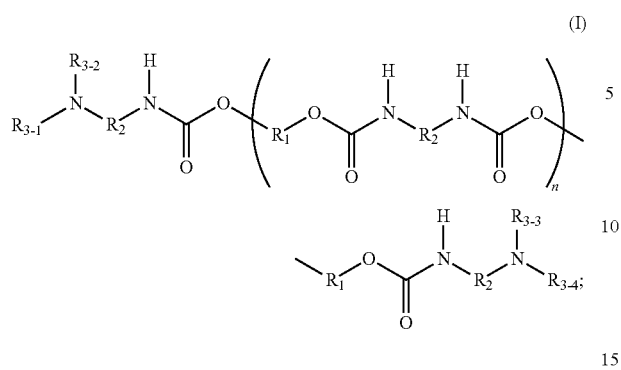

(I)

wherein, n is an integer of 0-10;

$R_1$ is selected from the group consisting of Formulas (II)-(IV):

(II)

(III)

(IV)

$R_4$ is $C_4$-$C_{12}$ alkyl, alkenyl, alkynyl, cycloalkyl, a polyether group or has a structure of Formula (V):

(V)

wherein, m is an integer of 0-5, and $R_5$ is of the following structural formula:

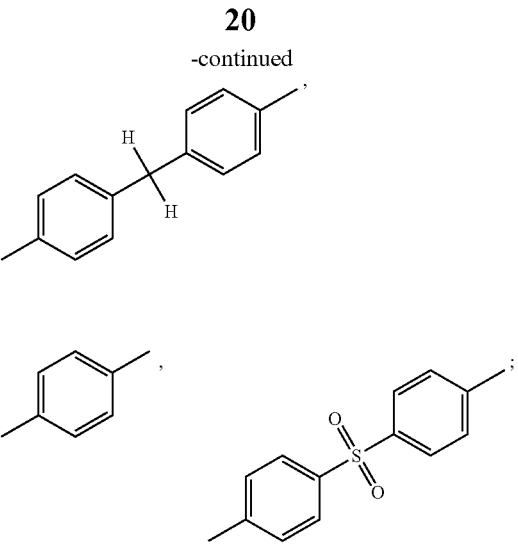

$R_2$ is $C_4$-$C_{12}$ alkyl, cycloalkyl, aryl, a polyether group, or enamine group;

$R_{3-1}$-$R_{3-4}$ are independently identical or different, and are hydrogen, $C_4$-$C_{12}$ alkyl, alkenyl, cycloalkyl, aryl, or polyether group, wherein at least one of $R_{3-1}$-$R_{3-4}$ contains an unsaturated-double-bond group.

2. The photosensitive resin composition of claim 1, wherein the preparation formulation of the (b) hydroxyurethane compound is characterized in having a [CC]/[NH$_2$] ratio of 0.5-0.9.

3. The photosensitive resin composition of claim 2, wherein the preparation formulation of the (b) hydroxyurethane compound is characterized in having a [CC]/[NH$_2$] ratio of 0.5-0.75.

4. The photosensitive resin composition of claim 1, wherein the preparation formulation of the (b) hydroxyurethane compound is characterized in having a [EPDXY]/[AHEW] ratio of 0.125-1.

5. The photosensitive resin composition of claim 1, which further comprises a solvent.

6. The photosensitive resin composition of claim 5, wherein the solvent is any one or more than one selected from the group consisting of alcohols, ethers, and ketones.

7. The photosensitive resin composition of claim 1, wherein with respect to 100 mass fractions of the (a) photo-polymerizable unsaturated compound, the (b) hydroxyurethane compound is 5 to 50 mass fractions.

8. The photosensitive resin composition of claim 1, which is used as a photoresist coating, wherein the photoresist coating is made through even coating and drying of the photosensitive resin composition.

9. A dry film photoresist, comprising a carrier film, a photoresist layer made of the photosensitive resin composition of claim 1, and a cover film.

10. The dry film photoresist of claim 9, wherein the (b) hydroxyurethane compound is an unsaturated-double-bond-containing hydroxyurethane compound, and has a structure of Formula (I):

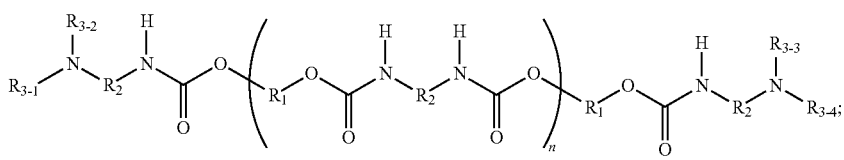

wherein, n is an integer of 0-10;

$R_1$ is selected from the group consisting of Formulas (II)-(IV):

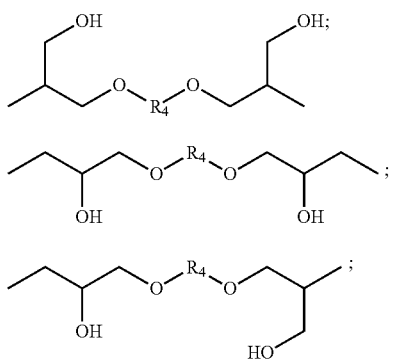

$R_4$ is $C_4$-$C_{12}$ alkyl, alkenyl, alkynyl, cycloalkyl, a polyether group or has a structure of Formula (V):

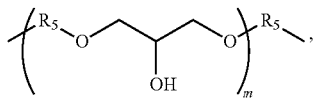

wherein, m is an integer of 0-5, and
$R_5$ is of the following structural formula:

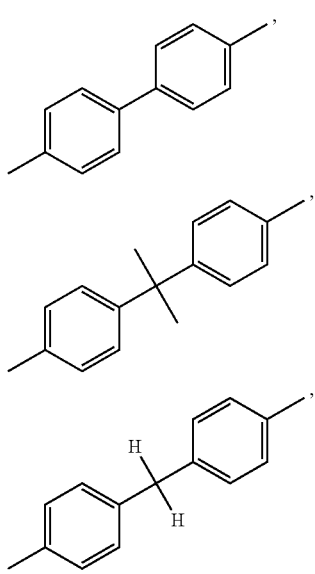

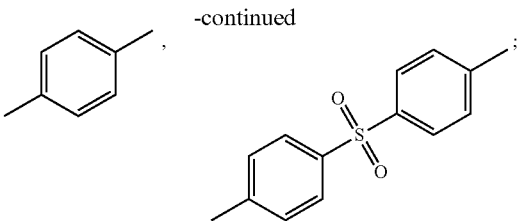

$R_2$ is $C_4$-$C_{12}$ alkyl, cycloalkyl, aryl, a polyether group, or enamine group;

$R_{3-1}$-$R_{3-4}$ are independently identical or different, and are hydrogen, $C_4$-$C_{12}$ alkyl, alkenyl, cycloalkyl, aryl, or polyether group, wherein at least one of $R_{3-1}$-$R_{3-4}$ contains an unsaturated-double-bond group.

11. A hydroxyurethane compound, which has a structure of Formula (I):

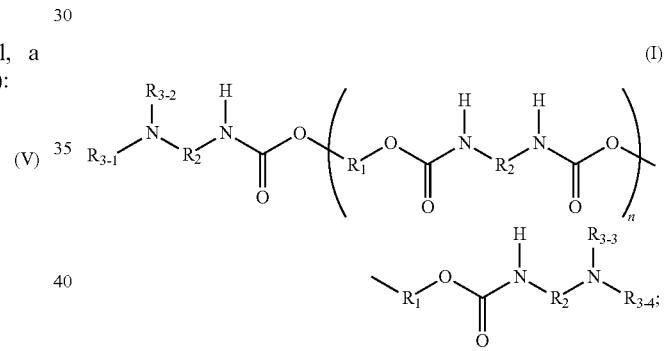

wherein, n is an integer of 0-10;

$R_1$ is selected from the group consisting of Formulas (II)-(IV):

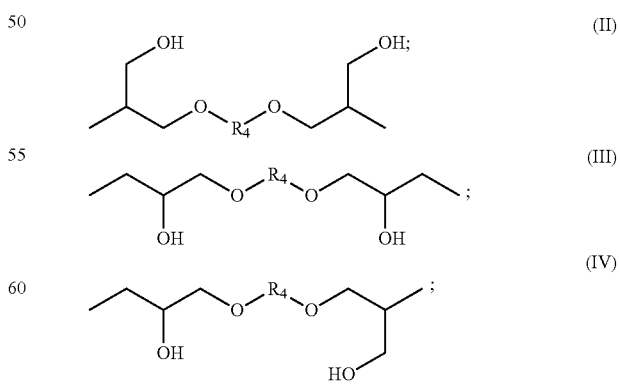

$R_4$ is $C_4$-$C_{12}$ alkyl, alkenyl, alkynyl, cycloalkyl, a polyether group or has a structure of Formula (V):

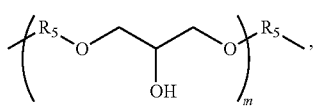
wherein, m is an integer of 0-5, and
$R_5$ is of the following structural formula:
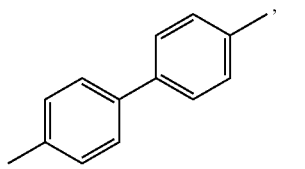
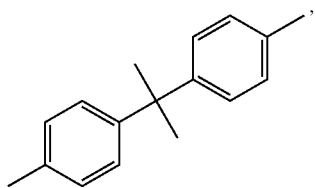
(V)
-continued
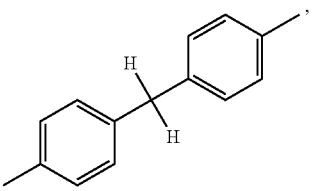
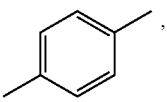
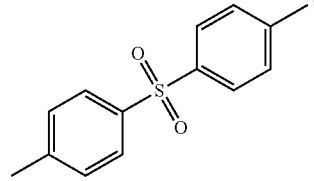
$R_2$ is $C_4$-$C_{12}$ alkyl, cycloalkyl, aryl, a polyether group, or enamine group;
$R_{3-1}$-$R_{3-4}$ are independently identical or different, and are hydrogen, $C_4$-$C_{12}$ alkyl, alkenyl, cycloalkyl, aryl, or polyether group, wherein at least one of $R_{3-1}$-$R_{3-4}$ contains an unsaturated-double-bond group.
* * * * *